United States Patent
Nystrom et al.

(10) Patent No.: US 9,692,383 B2
(45) Date of Patent: Jun. 27, 2017

(54) GAIN OPTIMIZED EQUALIZER

(71) Applicant: Sony Corporation, Tokyo (JP)

(72) Inventors: Martin Nystrom, Lund (SE); Sead Smailagic, Lund (SE); Andrej Petef, Lund (SE)

(73) Assignees: Sony Corporation, Tokyo (JP); Sony Mobile Communications Inc., Tokyo (JP)

( * ) Notice: Subject to any disclaimer, the term of this patent is extended or adjusted under 35 U.S.C. 154(b) by 198 days.

(21) Appl. No.: 14/403,242

(22) PCT Filed: Feb. 27, 2014

(86) PCT No.: PCT/IB2014/059282
§ 371 (c)(1),
(2) Date: Nov. 24, 2014

(87) PCT Pub. No.: WO2015/128696
PCT Pub. Date: Sep. 3, 2015

(65) Prior Publication Data
US 2016/0268989 A1    Sep. 15, 2016

(51) Int. Cl.
*H03G 5/00* (2006.01)
*H03G 5/16* (2006.01)
*H04R 3/00* (2006.01)
*H04R 29/00* (2006.01)
*H04R 3/04* (2006.01)

(52) U.S. Cl.
CPC ............ *H03G 5/165* (2013.01); *H03G 5/005* (2013.01); *H04R 3/007* (2013.01); *H04R 29/001* (2013.01); *H04R 3/04* (2013.01)

(58) Field of Classification Search
CPC ........ H03G 5/165; H03G 5/005; H04R 3/007; H04R 29/001; H04R 3/04
See application file for complete search history.

(56) References Cited

U.S. PATENT DOCUMENTS

| | | | |
|---|---|---|---|
| 9,281,794 B1 * | 3/2016 | Bongiovi | H03G 5/165 |
| 2005/0135644 A1 | 6/2005 | Qi | |
| 2014/0119546 A1 * | 5/2014 | Wei | H04R 3/04 |
| | | | 381/55 |

FOREIGN PATENT DOCUMENTS

WO    2008093954 A1    8/2008

OTHER PUBLICATIONS

Haddad K. C. et al.: "Design of two-channel equiripple FIR linear-phase quadrature mirror filters using the vector space projection method", IEEE Signal Processing Letters, IEEE Service Center, Piscataway, NJ, US, vol. 5, No. 7, Jul. 1, 1998, pp. 167-170, XP011428182, ISSN: 1070-9908, DOI: 10.1109/97.700918.

(Continued)

*Primary Examiner* — Andrew L Sniezek
(74) *Attorney, Agent, or Firm* — James C. Edwards; Moore & Van Allen, PLLC

(57) ABSTRACT

The invention is directed to determining a gain for an equalizer associated with an audio device. An exemplary method comprises determining a maximum audio output level allowed by an acoustic safety threshold; determining a setting of the equalizer; and adjusting a gain of the equalizer based on the setting and the maximum audio output level. The invention enables an audio device to simultaneously satisfy an acoustic safety threshold and deliver an optimum audio output level.

10 Claims, 4 Drawing Sheets

(56) References Cited

OTHER PUBLICATIONS

International Search Report and Written Opinion; Nov. 14, 2014; issued in International Patent Application No. PCT/IB2014/059282.
International Preliminary Report on Patentability; Sep. 9, 2016; issued in International Patent Application No. PCT/IB2014/059282.

* cited by examiner

Fig. 2
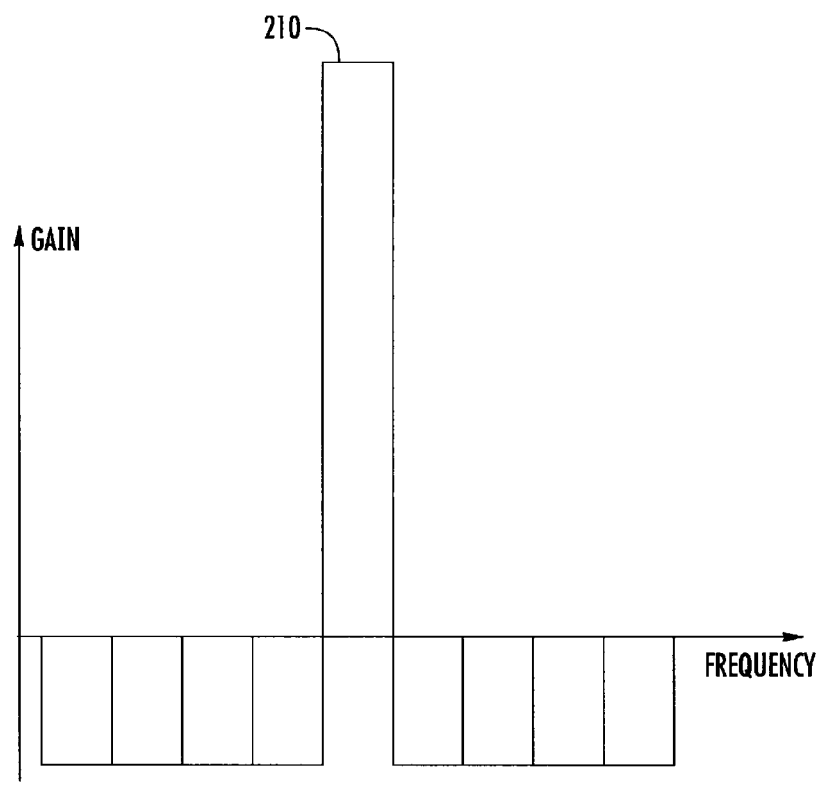
FIG. 2
Fig. 3
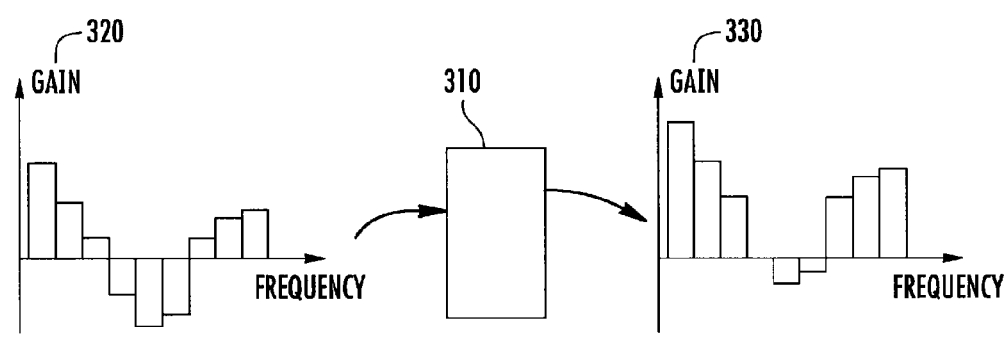
FIG. 3

GAIN OPTIMIZED EQUALIZER

BACKGROUND ART

Audio devices must conform to acoustic safety thresholds. Typically, conforming to these acoustic safety thresholds has led audio device manufacturers to reduce the maximum audio output levels for audio devices. Therefore, there is a need for techniques to increase the audio output levels while simultaneously conforming to acoustic safety thresholds.

SUMMARY

Embodiments of the invention are directed to a system, method, and computer program product for determining a gain for an equalizer associated with an audio device. An exemplary method comprises: determining a maximum audio output level allowed by acoustic safety threshold; determining a setting of the equalizer; and adjusting a gain of the equalizer based on the setting and the maximum audio output level.

In some embodiments, the equalizer comprises a floating gain equalizer (i.e., an equalizer with adjustable gain).

In some embodiments, the setting comprises a user-defined setting.

In some embodiments, the setting is associated with an audio effect.

In some embodiments, the acoustic safety threshold comprises European Norm (EN) 50332.

In some embodiments, the maximum audio output level is 100 dB (A) SPL (acoustic level) when a headphone is connected to the audio device or 150 mV (electrical level) when a 3.5 mm connector is connected to the audio device. The 3.5 mm connector is used for illustrative purposes only, and may represent a connector of any size.

In some embodiments, the maximum audio output level is associated with a worst case scenario when frequencies associated with audio output from the audio device are weighed equally when determining the maximum audio output level.

In some embodiments, the method further comprises generating an excitation vector from simulated noise associated with the acoustic safety threshold.

In some embodiments, the excitation vector comprises an audio output level for a frequency band associated with the equalizer.

In some embodiments, the method further comprises multiplying the excitation vector with a frequency gain setting associated with the equalizer.

In some embodiments, multiplying comprises term-by-term multiplying.

In some embodiments, the multiplication results in an output vector.

In some embodiments, the method further comprises summarizing the output vector using a root mean squares (RMS) technique.

In some embodiments, the adjusted gain is determined based on a ratio between the maximum audio output level and the summarized output vector.

In some embodiments, the gain of the equalizer represents a gain associated with any part of an audio chain associated with the audio device.

In some embodiments, an audio device is provided for determining a gain for an equalizer associated with the audio device. The audio device comprises: a memory; a processor; and a module, stored in the memory, executable by the processor, and configured to: determine a maximum audio output level allowed by an acoustic safety threshold; determine a setting of the equalizer; and adjust a gain of the equalizer based on the setting and the maximum audio output level.

In some embodiments, a computer program product is provided for determining a gain for an equalizer associated with an audio device. The computer program product comprises a non-transitory computer-readable medium comprising code configured to: determine a maximum audio output level allowed by an acoustic safety threshold; determine a setting of the equalizer; and adjust a gain of the equalizer based on the setting and the maximum audio output level.

BRIEF DESCRIPTION OF DRAWINGS

Figure 1:
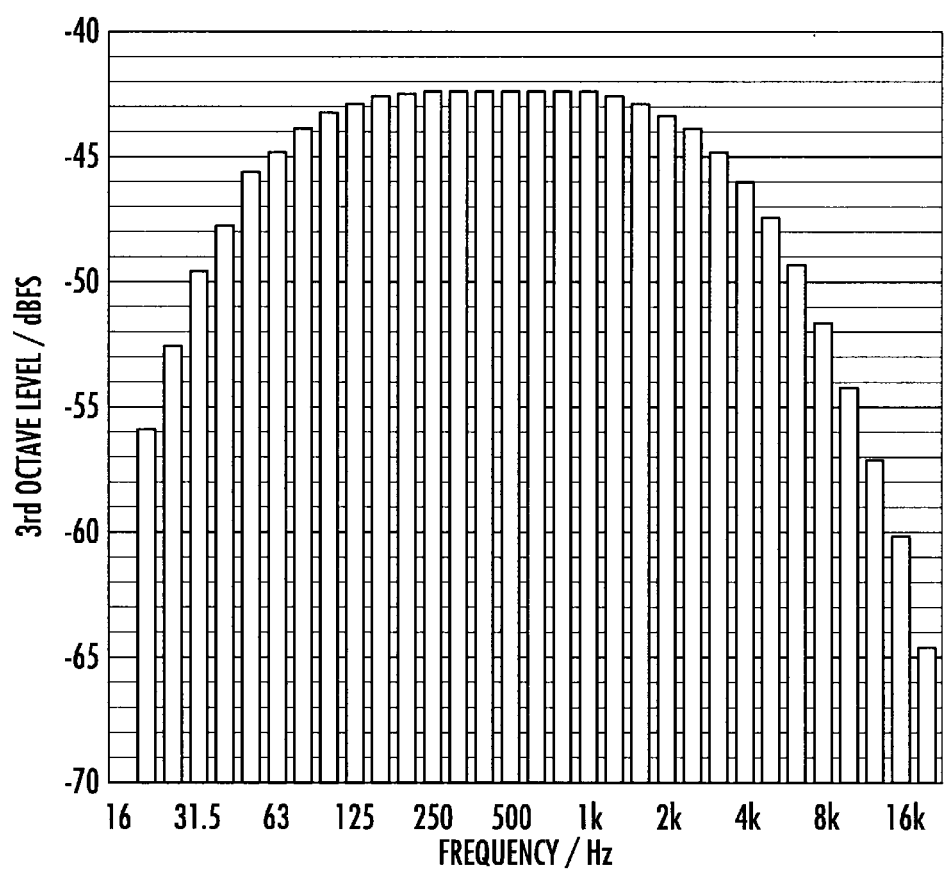
Figure 4:
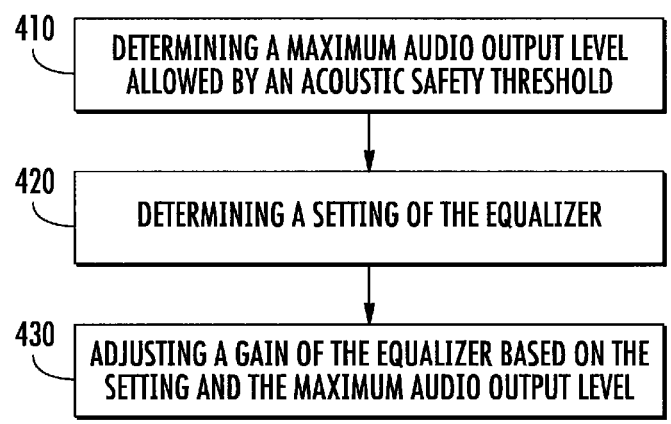

Having thus described embodiments of the invention in general terms, reference will now be made to the accompanying drawings, where:

FIG. 1 illustrates noise levels for testing under an acoustic safety threshold, in accordance with embodiments of the present invention;

FIG. 2 illustrates a scenario where an audio device is tuned to allow a midrange peak output, in accordance with embodiments of the present invention;

FIG. 3 illustrates a block diagram for a gain optimized equalizer, in accordance with embodiments of the present invention; and FIG. 4 illustrates a process flow for a gain optimized equalizer, in accordance with embodiments of the present invention.

Figure 5:
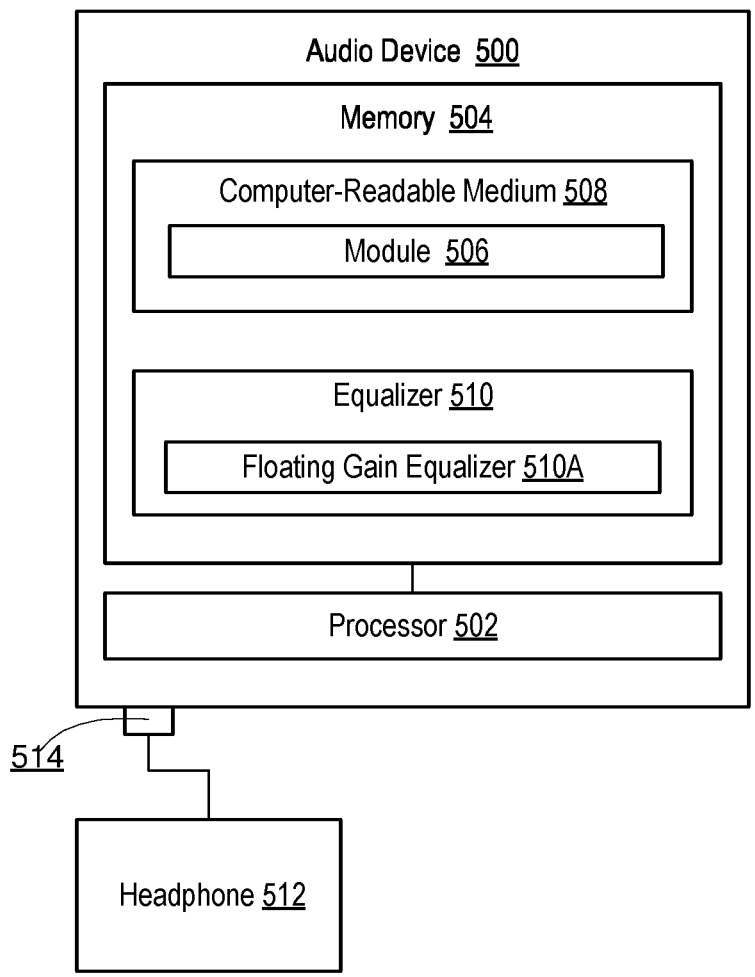

FIG. 5 illustrates an audio device in accordance with embodiments of the present invention.

DESCRIPTION OF EMBODIMENTS

Embodiments of the present invention now may be described more fully hereinafter with reference to the accompanying drawings, in which some, but not all, embodiments of the invention are shown. Indeed, the invention may be embodied in many different forms and should not be construed as limited to the embodiments set forth herein; rather, these embodiments are provided so that this disclosure may satisfy applicable legal requirements. Like numbers refer to like elements throughout.

Consumer electronics intended for audio playback and phone calls can be regulated acoustic safety regulations (e.g., European Norm (EN) 50332). EN 50332 defines maximum sound pressure levels. EN 50332 and other acoustic regulations have contributed to reducing hearing losses caused by excessive production of audio levels from playback devices. In addition, consumer electronics intended for audio playback and phone calls can be the subject of recommendations and/or standards issued by medical and/or consumer safety organizations or groups in a particular jurisdiction or jurisdictions. Although the specification refers to EN 50332, the present invention is not limited to EN 50332 or any particular acoustic safety regulation, recommendation or standard. Accordingly, an "acoustic safety threshold" is used herein to generically refer to such acoustic safety regulations, recommendations and/or standards that may apply to consumer electronics intended for audio playback and phone calls. Audio device makers attempt to maximize audio output levels for audio devices, while complying with acoustic safety threshold.

Referring now to FIG. 1, FIG. 1 illustrates testing of an audio device under EN50332 or any other acoustic safety threshold. EN50332 uses playback of a special type of simulated noise to test an audio device. The simulated noise is associated with an acoustic safety threshold (e.g., International Electrotechnical Commission (IEC) 60268-1). This noise is defined by an audio level for each frequency. The noise is played by an audio device, and in order to pass the test, the audio output level must be less than or equal to 100 dB(A) SPL in a headphone directly connected to the audio device (acoustic level), or must be less than or equal to 150 mV (electrical level) when the output from the audio device goes to a 3.5 mm connector. The 3.5 mm connector is used for illustrative purposes only, and may represent a connector of any size. EN50332 also specifies that every step in the audio chain where the user can make an audio setting selection should be set to the worst possible case. The same may be the case for other acoustic safety threshold. Therefore, the goal for audio device manufacturers is to find the worst case scenario and reduce the gain of the audio device until the audio device passes the worst case scenario test. As used herein, a worst case scenario is a scenario where frequencies (e.g., all frequencies) associated with the audio output are weighed equally or substantially equally when determining the audio output levels.

The problem is that the worst case scenario reduces the gain of the audio device that is needed for settings other than that associated with the worst case scenario. Referring now to FIG. 2, FIG. 2 presents an example of a scenario where the worst case scenario reduces the gain of the audio device that is needed for other audio settings. As indicated in FIG. 2, when the audio device is tuned to allow a midrange peak output 210, the gain for other audio settings is reduced more than that required by the standards for those other audio settings.

When an audio player is tuned to a user-defined equalizer (or an audio effect selected by the user), this user-defined equalizer sets the worst case scenario, thereby limiting audio output for normal listening settings more than required by the standards for those normal listening settings. As used herein, an equalizer 510 (shown in FIG. 5) refers to at least one of software or hardware used to alter the frequency response of an audio device using a linear filter. The present invention is directed to using an equalizer with a floating gain, and then calculating or determining an allowed gain (e.g., a maximum gain) for an audio device based on the current setting of the equalizer. The present invention may be embodied in software only, hardware only, or a combination of both hardware and software. As used herein, a floating gain equalizer 510A (shown in FIG. 5) refers to an equalizer where the gain of the equalizer may be adjusted.

When an audio player 500 (shown in FIG. 5) is tuned to a user-defined equalizer (or an audio effect selected by the user), the present invention determines the gain required to achieve an audio output level less than or equal to 100 dB(A) SPL in a headphone 512 (shown in FIG. 5) directly connected to the audio device 500, or an audio output level less than or equal to 150 mV when the output from the audio device 500 goes to a 3.5 mm connector 514 (shown in FIG. 5). Achieving these output levels is required to satisfy acoustic safety regulations (e.g., EN 50332).

Referring now to FIG. 3, FIG. 3 illustrates a block diagram for the present invention. The process flow associated with the invention is embodied in block 310 of FIG. 3 and is described in further detail below and in FIG. 4. As indicated in FIG. 3, the present invention transforms the frequency response presented in graph 320 into the frequency response presented in graph 330.

The present invention generates an excitation vector. The excitation vector is generated from simulated noise associated with an audio device acoustic safety threshold (e.g., IEC 60268-1). The simulated noise must satisfy the requirements of an acoustic safety threshold (e.g., EN 50332). The excitation vector comprises an audio output level for each frequency band associated with the selected equalizer. The excitation vector is subsequently multiplied (e.g., term-by-term multiplied) with the frequency gain settings as defined by the selected equalizer. Since the excitation vector comprises multiple components, term-by-term multiplication comprises individually multiplying each component with the frequency gain settings associated with the selected equalizer.

The resultant output vector is summarized by a root mean squares (RMS) technique, thereby producing a single output vector. Subsequently, the present invention determines the gain (e.g., the allowed gain) based on the ratio between the allowed audio output level (e.g., 150 mV when the output from the audio device goes to a 3.5 mm connector or 100 dB(A) SPL in a headphone directly connected to the audio device) and the output vector. Therefore, the present invention determines the gain for an user-defined setting (e.g., audio effect or equalizer) each time the setting is adjusted. The present invention enables an audio device to simultaneously satisfy an acoustic safety threshold and deliver an optimum audio output level.

Referring now to the process flow of FIG. 4, FIG. 4 illustrates a process flow for determining a gain for an equalizer (e.g., a floating or adjustable gain equalizer) associated with an audio device. At block 410, the process flow comprises determining a maximum audio output level allowed by an acoustic safety threshold (e.g., EN 50332). In some embodiments, the maximum audio output level is associated with a worst case scenario when frequencies associated with audio output from the audio device are weighed equally or substantially equally when determining the maximum audio output level. At block 420, the process flow comprises determining a setting (e.g., a user-defined audio effect) of the equalizer. At block 430, the process flow comprises adjusting a gain of the equalizer based on the setting and the maximum audio output level. In some embodiments, the process flow described herein is performed by the audio device, while in other embodiments, the process flow is performed by another device or system in communication with the audio device. As used herein, adjusting the gain of the equalizer refers to adjusting the gain anywhere in the audio chain associated with the audio device. Therefore, adjusting the gain of the equalizer is not limited to adjusting the gain of the equalizer. The present invention may be implemented as a separate gain stage anywhere in the audio chain.

As described previously, the process flow further comprises generating an excitation vector from simulated noise associated with the acoustic safety threshold. The excitation vector comprises an audio output level for a frequency band associated with the equalizer. In some embodiments, the process flow further comprises multiplying (e.g., term-by-term multiplying) the excitation vector with a frequency gain setting associated with the equalizer. The multiplication results in an output vector. The output vector is then summarized using a root mean squares (RMS) technique. The adjusted gain as specified in block 430 is determined based on a ratio between the maximum audio output level and the summarized output vector.

The invention is not limited to any particular types of audio devices. As used herein, an audio device may also be referred to as a device, a mobile device, or a system. Examples of audio devices include portable or non-portable media devices, mobile phones or other mobile computing devices, mobile televisions, laptop computers, smart screens, tablet computers or tablets, portable desktop computers, e-readers, eyewear, scanners, portable media devices, gaming devices, cameras or other image-capturing devices, watches, bands (e.g., wristbands) or other wearable devices, or other portable or non-portable computing or non-computing devices.

Referring to FIG. 5, each audio device 500 or system described herein is a computing device that comprises a processor 502, a memory 504, and a module 506 stored in the memory 504, executable by the processor 502, and configured to perform the various processes described herein. Each processor described herein generally includes circuitry for implementing audio, visual, and/or logic functions. For example, the processor may include a digital signal processor device, a microprocessor device, and various analog-to-digital converters, digital-to-analog converters, and other support circuits. The processor may also include functionality to operate one or more software programs based at least partially on computer-executable program code portions thereof, which may be stored, for example, in a memory.

Each memory 504 may include any computer-readable medium 508. For example, memory may include volatile memory, such as volatile random access memory (RAM) having a cache area for the temporary storage of information. Memory may also include nonvolatile memory, which may be embedded and/or may be removable. The nonvolatile memory may additionally or alternatively include an EEPROM, flash memory, and/or the like. The memory may store any one or more of pieces of information and data used by the system in which it resides to implement the functions of that system.

In accordance with embodiments of the invention, the term "module" with respect to a system (or a device) may refer to a hardware component of the system, a software component of the system, or a component of the system that includes both hardware and software. As used herein, a module may include one or more modules, where each module may reside in separate pieces of hardware or software.

Although many embodiments of the present invention have just been described above, the present invention may be embodied in many different forms and should not be construed as limited to the embodiments set forth herein; rather, these embodiments are provided so that this disclosure will satisfy applicable legal requirements. Also, it will be understood that, where possible, any of the advantages, features, functions, devices, and/or operational aspects of any of the embodiments of the present invention described and/or contemplated herein may be included in any of the other embodiments of the present invention described and/or contemplated herein, and/or vice versa. In addition, where possible, any terms expressed in the singular form herein are meant to also include the plural form and/or vice versa, unless explicitly stated otherwise. As used herein, "at least one" shall mean "one or more" and these phrases are intended to be interchangeable. Accordingly, the terms "a" and/or "an" shall mean "at least one" or "one or more," even though the phrase "one or more" or "at least one" is also used herein. Like numbers refer to like elements throughout.

As will be appreciated by one of ordinary skill in the art in view of this disclosure, the present invention may include and/or be embodied as an apparatus (including, for example, a system, machine, device, computer program product, and/or the like), as a method (including, for example, a business method, computer-implemented process, and/or the like), or as any combination of the foregoing. Accordingly, embodiments of the present invention may take the form of an entirely business method embodiment, an entirely software embodiment (including firmware, resident software, micro-code, stored procedures in a database, etc.), an entirely hardware embodiment, or an embodiment combining business method, software, and hardware aspects that may generally be referred to herein as a "system." Furthermore, embodiments of the present invention may take the form of a computer program product that includes a computer-readable storage medium having one or more computer-executable program code portions stored therein. As used herein, a processor, which may include one or more processors, may be "configured to" perform a certain function in a variety of ways, including, for example, by having one or more general-purpose circuits perform the function by executing one or more computer-executable program code portions embodied in a computer-readable medium, and/or by having one or more application-specific circuits perform the function.

It will be understood that any suitable computer-readable medium may be utilized. The computer-readable medium may include, but is not limited to, a non-transitory computer-readable medium, such as a tangible electronic, magnetic, optical, electro-magnetic, infrared, and/or semiconductor system, device, and/or other apparatus. For example, in some embodiments, the non-transitory computer-readable medium includes a tangible medium such as a portable computer diskette, a hard disk, a random access memory (RAM), a read-only memory (ROM), an erasable programmable read-only memory (EPROM or Flash memory), a compact disc read-only memory (CD-ROM), and/or some other tangible optical and/or magnetic storage device. In other embodiments of the present invention, however, the computer-readable medium may be transitory, such as, for example, a propagation signal including computer-executable program code portions embodied therein.

One or more computer-executable program code portions for carrying out operations of the present invention may include object-oriented, scripted, and/or unscripted programming languages, such as, for example, Java, Perl, Smalltalk, C++, SAS, SQL, Python, Objective C, JavaScript, and/or the like. In some embodiments, the one or more computer-executable program code portions for carrying out operations of embodiments of the present invention are written in conventional procedural programming languages, such as the "C" programming languages and/or similar programming languages. The computer program code may alternatively or additionally be written in one or more multi-paradigm programming languages, such as, for example, F#.

Some embodiments of the present invention are described herein with reference to flowchart illustrations and/or block diagrams of apparatus and/or methods. It will be understood that each block included in the flowchart illustrations and/or block diagrams, and/or combinations of blocks included in the flowchart illustrations and/or block diagrams, may be implemented by one or more computer-executable program code portions. These one or more computer-executable program code portions may be provided to a processor of a general purpose computer, special purpose computer, and/or some other programmable data processing apparatus in order to produce a particular machine, such that the one or more computer-executable program code portions, which execute via the processor of the computer and/or other programmable data processing apparatus, create mechanisms for implementing the steps and/or functions represented by the flowchart(s) and/or block diagram block(s).

The one or more computer-executable program code portions may be stored in a transitory and/or non-transitory computer-readable medium (e.g., a memory, etc.) that can direct, instruct, and/or cause a computer and/or other programmable data processing apparatus to function in a particular manner, such that the computer-executable program code portions stored in the computer-readable medium produce an article of manufacture including instruction mechanisms which implement the steps and/or functions specified in the flowchart(s) and/or block diagram block(s).

The one or more computer-executable program code portions may also be loaded onto a computer and/or other programmable data processing apparatus to cause a series of operational steps to be performed on the computer and/or other programmable apparatus. In some embodiments, this produces a computer-implemented process such that the one or more computer-executable program code portions which execute on the computer and/or other programmable apparatus provide operational steps to implement the steps specified in the flowchart(s) and/or the functions specified in the block diagram block(s). Alternatively, computer-implemented steps may be combined with, and/or replaced with, operator- and/or human-implemented steps in order to carry out an embodiment of the present invention.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other changes, combinations, omissions, modifications and substitutions, in addition to those set forth in the above paragraphs, are possible. Those skilled in the art will appreciate that various adaptations, modifications, and combinations of the just described embodiments can be configured without departing from the scope and spirit of the invention. Therefore, it is to be understood that, within the scope of the appended claims, the invention may be practiced other than as specifically described herein.

The invention claimed is:

1. A method for determining a gain for an equalizer associated with an audio device, the method comprising:
    determining a maximum audio output level allowed by an acoustic safety threshold;
    determining a setting of the equalizer; and
    adjusting a gain of the equalizer based on the setting and the maximum audio output level, wherein adjusting the gain comprises:
        generating an excitation vector from simulated noise associated with the acoustic safety threshold,
        multiplying the excitation vector with a frequency gain setting associated with the equalizer, wherein the multiplication results in an output vector,
        summarizing the output vector using a root mean squares (RMS) technique, and
        adjusting the gain based on a ratio between the maximum audio output level and the summarized output vector.

2. The method of claim 1, wherein the equalizer comprises a floating gain equalizer.

3. The method of claim 1, wherein the setting comprises a user-defined setting.

4. The method of claim 1, wherein the setting is associated with an audio effect.

5. The method of claim 1, wherein the acoustic safety threshold comprises European Norm (EN) 50332.

6. The method of claim 1, wherein the maximum audio output level is 100 dB (A) SPL when a headphone is connected to the audio device or 150 mV when a 3.5 mm connector is connected to the audio device.

7. The method of claim 1, wherein the maximum audio output level is associated with a worst case scenario when frequencies associated with audio output from the audio device are weighed equally when determining the maximum audio output level.

8. The method of claim 1, wherein the excitation vector comprises an audio output level for a frequency band associated with the equalizer.

9. An audio device for determining a gain for an equalizer associated with the audio device, the audio device comprising:
    a memory;
    a processor;
    a module, stored in the memory, executable by the processor, and configured to:
        determine a maximum audio output level allowed by an acoustic safety threshold;
        determine a setting of the equalizer; and
        adjust a gain of the equalizer based on the setting and the maximum audio output level, wherein adjust the gain comprises:
        generate an excitation vector from simulated noise associated with the acoustic safety threshold,
        multiply the excitation vector with a frequency gain setting associated with the equalizer, wherein the multiplication results in an output vector,
        summarize the output vector using a root mean squares (RMS) technique, and
        adjust the gain based on a ratio between the maximum audio output level and the summarized output vector.

10. A computer program product for determining a gain for an equalizer associated with an audio device, the computer program product comprising a non-transitory computer-readable medium comprising code configured to:
    determine a maximum audio output level allowed by an acoustic safety threshold;
    determine a setting of the equalizer; and
    adjust a gain of the equalizer based on the setting and the maximum audio output level, wherein adjust the gain comprises:
        generate an excitation vector from simulated noise associated with the acoustic safety threshold,
        multiply the excitation vector with a frequency gain setting associated with the equalizer, wherein the multiplication results in an output vector,
        summarize the output vector using a root mean squares (RMS) technique, and
        adjust the gain based on a ratio between the maximum audio output level and the summarized output vector.

* * * * *